United States Patent [19]

Agostino et al.

[11] Patent Number: 5,270,151
[45] Date of Patent: Dec. 14, 1993

[54] SPIN ON OXYGEN REACTIVE ION ETCH BARRIER

[75] Inventors: Peter A. Agostino, Canaan; Ajay P. Giri, Poughkeepsie, both of N.Y.; Hiroyuki Hiraoka, Saratoga, Calif.; Carlton G. Willson, San Jose, Calif.; Daniel J. Dawson, San Jose, Calif.

[73] Assignee: International Business Machines Corporation, Armonk, N.Y.

[21] Appl. No.: 852,865

[22] Filed: Mar. 17, 1992

[51] Int. Cl.$^5$ .............................................. G03F 7/26
[52] U.S. Cl. .................................. 430/313; 430/311; 430/317; 430/329; 156/643; 156/660
[58] Field of Search ............... 430/311, 313, 314, 317, 430/329; 156/643, 652, 653, 659.1, 660

[56] References Cited

U.S. PATENT DOCUMENTS

| | | | |
|---|---|---|---|
| 2,182,208 | 12/1939 | Nason | 524/313 |
| 2,413,582 | 12/1946 | Rust et al. | 556/478 |
| 2,707,191 | 4/1955 | Martin et al. | 525/480 |
| 2,920,058 | 1/1960 | Brown | 525/507 |
| 3,398,122 | 8/1968 | Shepard et al. | 525/480 |
| 3,481,901 | 12/1969 | Prochaska | 525/480 |
| 3,911,169 | 10/1975 | Lesaicherre et al. | 427/96 |
| 4,045,397 | 8/1977 | Parkinson | 524/262 |
| 4,237,259 | 12/1980 | Keeley | 528/204 |
| 4,238,375 | 12/1980 | Blount | 525/446 |
| 4,451,969 | 6/1984 | Chaudhuri | 437/2 |
| 4,565,846 | 1/1986 | Saito et al. | 525/101 |
| 4,599,243 | 7/1986 | Sachdev et al. | 156/643 |
| 4,631,322 | 12/1986 | Isayama et al. | 525/480 |
| 4,692,398 | 12/1987 | Durham | 430/329 |
| 4,751,170 | 6/1988 | Mimura et al. | 430/296 |
| 4,770,974 | 9/1988 | Hiraoka | 430/270 |
| 4,782,008 | 11/1988 | Babich et al. | 430/313 |
| 4,806,458 | 2/1989 | Durham | 430/331 |

OTHER PUBLICATIONS

M. Toriumi et al., Alakali–Developable Silicon Containing Positive Photoresist(ASTRO) for a Two–Layer Resist System, J. Electrochem Soc., vol. 134, No. 4, Apr. 1987.
Y. Saotome et al., A Silicon Containing Positive Photoresist for a Bilayer Resist System, J. electrochem Soc., Apr. 1985.
F. Coopmans et al., DESIRE: A New Route to Submicron Optical Lithography, Solid State Technology, Jun. 1987.
F. Watanabe et al., Oxygen reactive ion etching of organosilicon polymers, J. Vac. Sci. Technol. B 4 (1), Jan./Feb. 1986.
C. W. Wilkins, Jr. et al., An organosilicon novalac resin for multilevel resist applications, J. Vac. Sci. Technol., Jan./Feb. 1985.

Primary Examiner—Marion E. McCamish
Assistant Examiner—Kathleen Duda
Attorney, Agent, or Firm—Whitham & Marhoefer

[57] ABSTRACT

Reaction products of organosilane compounds or polydiphenylsilazane compounds and a novolac resin having phenolic groups can be used as $O_2$ RIE barrier materials in semiconductor etching processes. These materials have low $O_2$ etch rates and can be spun on to form crack-free thick layers. Particular RIE barrier materials contemplated have the general formula:

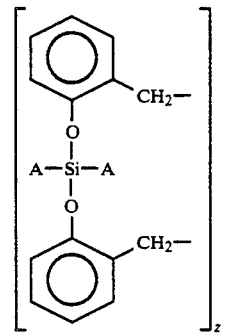

wherein A is a methyl or phenyl group.

6 Claims, 2 Drawing Sheets

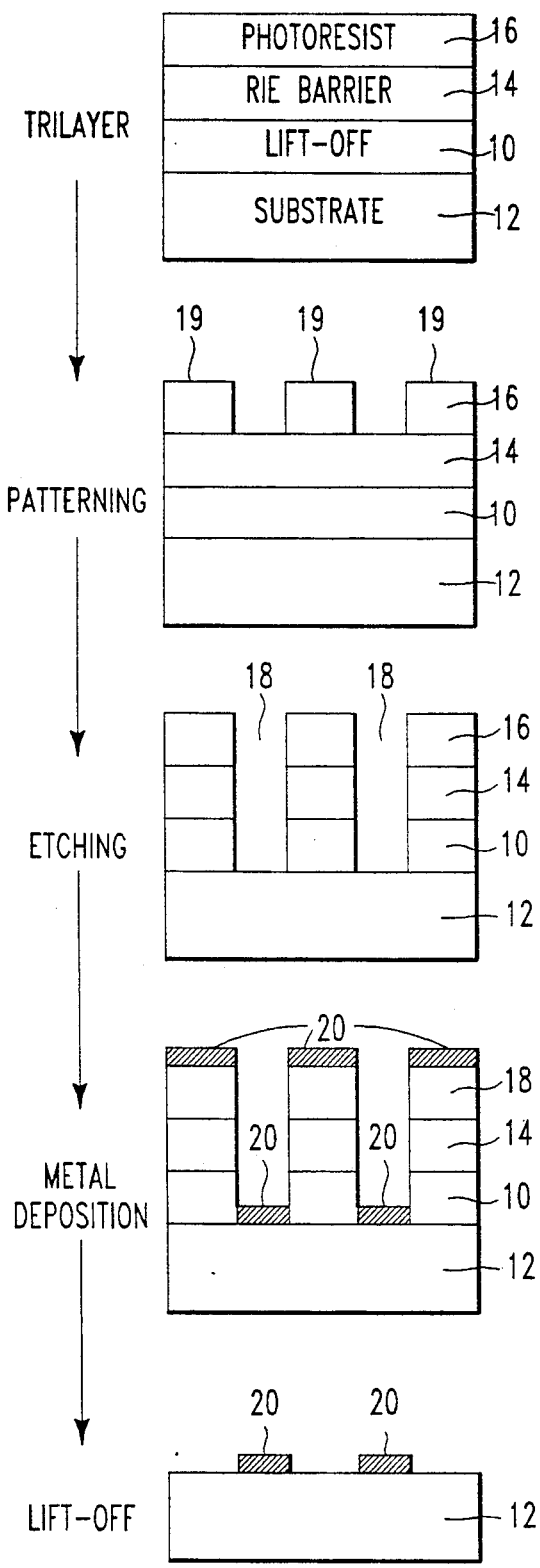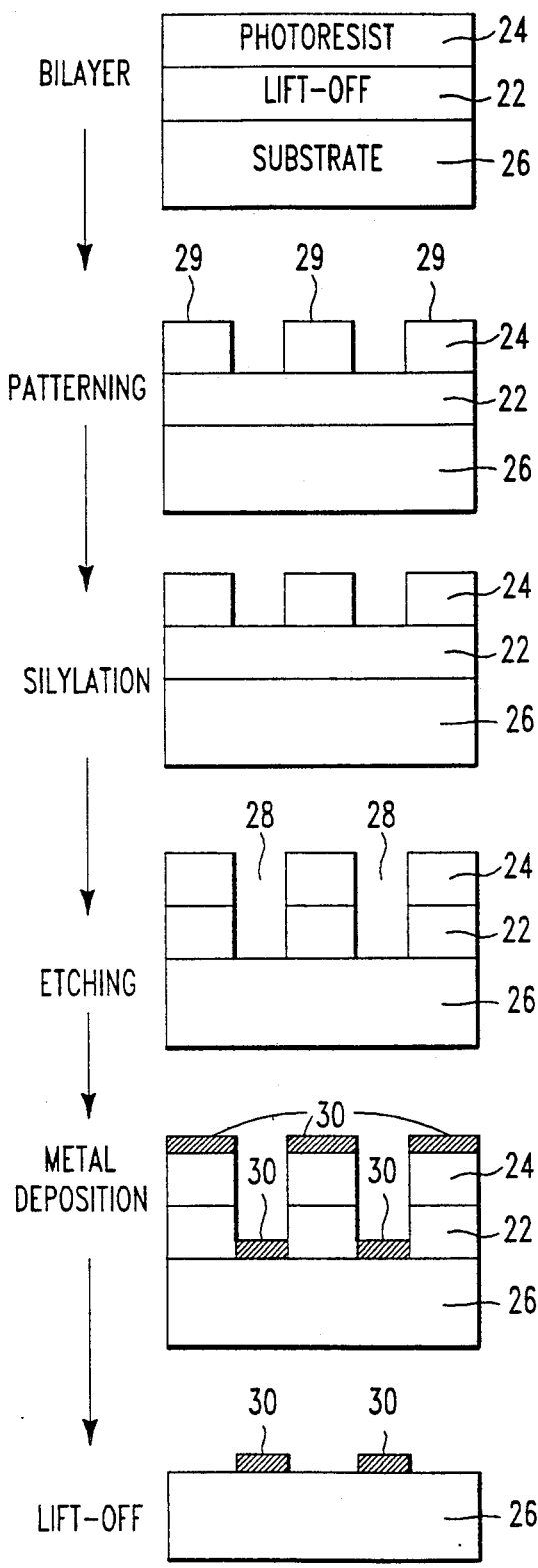
FIG. 1 PRIOR ART
FIG. 2 PRIOR ART

1. APPLICATION OF SOLVENT SENSITIVE POLYMER:

2. APPLICATION OF THE RIE BARRIER BY SPINNING:

3. APPLICATION OF THE PHOTOSENSITIVE RESIST:

4. EXPOSE AND DEVELOP:

5. REACTIVE ION ETCH:

SPIN ON OXYGEN REACTIVE ION ETCH BARRIER

BACKGROUND OF THE INVENTION

1. Field of the Invention

The present invention is generally related to a reactive ion etch (RIE) barrier material used in semiconductor processing and, more particularly, to a method of using the reaction products of a novolac resin and either a polydiphenylsilazane or an organosilane compound in semiconductor or integrated circuit manufacturing processes.

2. DESCRIPTION OF THE PRIOR ART

In lift-off and/or multilayer processes, it is often necessary to employ a layer of film which is capable of withstanding an oxygen reactive ion etch (RIE). FIG. 1 shows the steps in a common trilayer process which employs a RIE barrier layer. First, a lift-off polymer 10, typically a solvent sensitive polymer, is applied to a substrate 12. An RIE barrier layer 14, such as hexamethyldisilazane (HMDS), silicon nitride ($Si_3N_4$) or silicon dioxide ($SiO_2$), is applied over the lift-off polymer 10. Finally, a photoresist layer 16 is applied to the top to complete the trilayer structure. The lift-off polymer 10, RIE barrier layer 14, and photoresist layer 16 can be applied by many well-known techniques including using a plasma tool or by spinning procedures. The photoresist layer 16 is then patterned by imaging and developing or by other suitable techniques. The pattern 19 is then transferred to the substrate 12 by first etching the RIE barrier layer 14 with $CF_4$ and then etching the lift-off polymer 10 with $O_2$ RIE. During $O_2$ RIE, the photoresist layer 16 may erode away; however, the RIE barrier layer 14 remaining under the photoresist layer 16 will protect the underlying substrate 12. A blanket layer of metal 20 is then deposited by evaporation or by other suitable techniques, with the trilayer stacks serving as a stencil. Finally, the trilayer stacks are removed by dissolving the lift-off polymer 10 with an appropriate solvent.

FIG. 2 shows the process steps in a silylation technique. Unlike the trilayer process, the silylation technique only requires the deposition of a lift-off polymer 22 and a photoresist 24 on top of the substrate 26. The photoresist 24 is then patterned by conventional imaging and developing techniques. Before the pattern 29 is transferred to the substrate 26, the photoresist 24 is converted to an RIE barrier via silylation. The converted photoresist 24 then serves as a suitable stencil for patterning the substrate 26 in the same manner described in conjunction with the trilayer process, except that only an $O_2$ RIE etch is required. As can be seen from FIG. 2, a blanket layer of metal 30 is deposited with the bilayer stack of photoresist 24 and lift-off polymer 22 serving as a stencil. Subsequently, the bilayer stack is removed by dissolving the lift-off polymer 22.

Heretofore, the RIE barrier layers used in the trilayer or silylation techniques have not been satisfactorily etch-resistant during RIE of the lift-off polymer using an $O_2$ ambient. Consequently, portions of the RIE barrier material are etched away during this process and deposited as a residue in the etched areas 18 and 28 of FIGS. 1 and 2. Removal of this RIE barrier material accidentally deposited in the etched areas 18 and 28 requires further clean-up steps.

Spinning procedures allow uniform coats of a material to be applied to a substrate. It would be advantageous to apply an RIE barrier material by spin-on procedures. However, currently available spin on glasses which can be used as RIE barrier materials, have been found to have internal stresses which result in film cracking if they are spun on to a thickness of greater than 5000Å. Hence, there is a need for a material which can be spun on a substrate to form relatively thick layers (e.g., 2.5 $\mu$m) and used as an RIE barrier material.

SUMMARY OF THE INVENTION

It is therefore an object of the present invention to provide a method of using the reaction products of a novolac resin and various polydiphenylsilazane or organosilane compounds as a spin on $O_2$ RIE barrier layer.

The reaction products of certain organosilane compounds and a novolac resin have extremely low etch rates when performing RIE in an $O_2$ ambient. In addition, these reaction products can be spun on to thicknesses of up to 2.5 $\mu$m without cracking. Hence, these reaction products are ideal as an RIE barrier material.

BRIEF DESCRIPTION OF THE DRAWINGS

The foregoing and other objects, aspects and advantages will be better understood from the following detailed description of the preferred embodiments of/the invention with reference to the drawings, in which:

FIG. 1 are sequential cross-sectional side views of a substrate being patterned with metal by a prior art trilayer process;

FIG. 2 are sequential cross-sectional side views of a substrate being patterned in a prior art silylation process.

DETAILED DESCRIPTION OF A PREFERRED EMBODIMENT OF THE INVENTION

Figure 3:
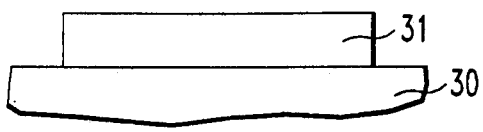
FIG. 3 are sequential cross-sectional side views of a trilayer process utilizing a spin on RIE barrier material in accordance with the method of the present invention.
Figure 3:
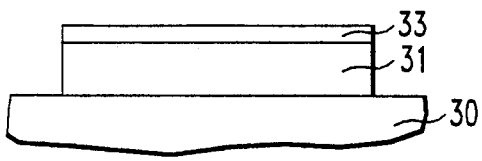
Figure 3:
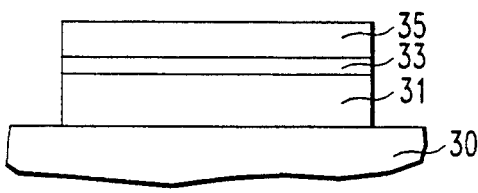
Figure 3:
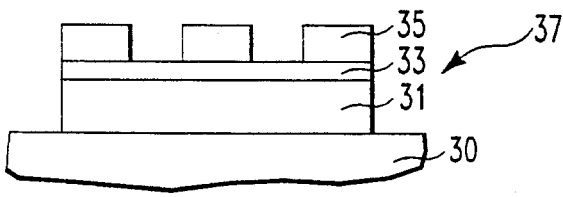
Figure 3:
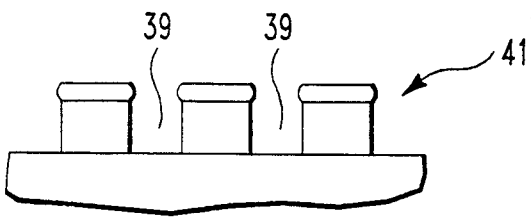

Organosilane compounds have been reacted with a novolac resin to produce materials which can be used as spin-on $O_2$ RIE barrier (SORB) materials. Representative reactions for producing the SORB materials are as follows:

Equation I

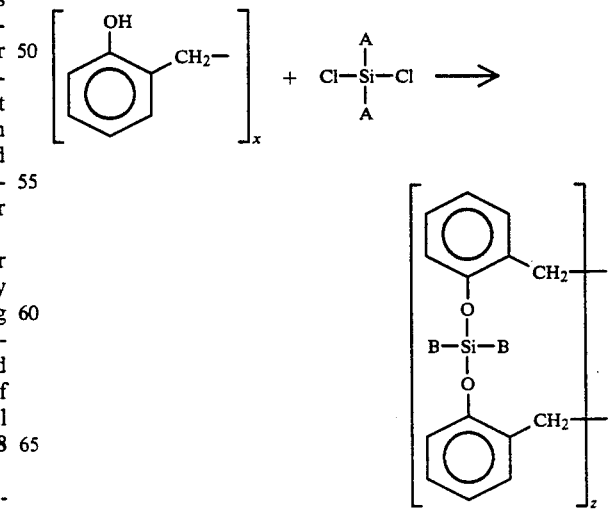

Equation II

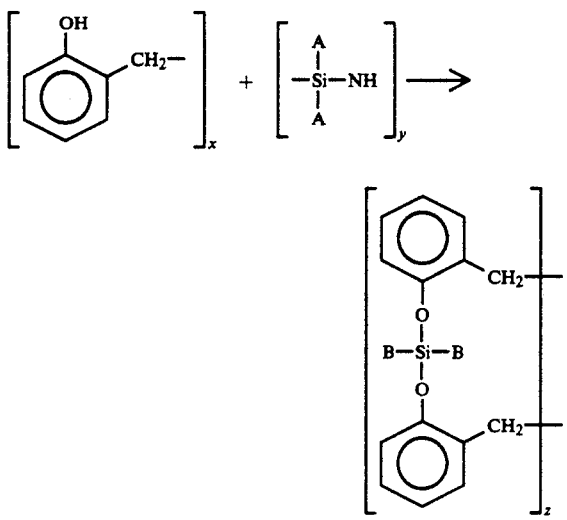

Equation III

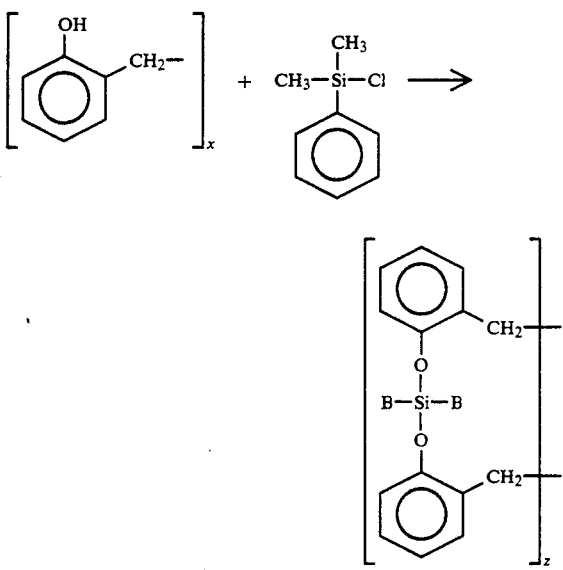

Where B can be a methyl or a phenyl constituent, and may be the same or different, and where Z is greater than 1. The example sections discussed below provide the synthesis route for producing SORB materials according to this invention. U.S. Pat. No. 3,481,901 discloses similar methods of making these types of materials, but fails to recognize their utility as an RIE barrier material.

Novolac resins, such as Alnovol PN430, are a polymer product of a phenol-formaldehyde condensation reaction, and are commercially available from Hoechst Celanese. Other novolac resins having phenolic groups should react in the same manner. Organosilane compounds like those noted in Equations I and III and polydiphenylsilazane compounds as in Equation II are commercially available from Petrarch Chemicals or Aldrich. It is noted that other halogen leaving groups besides chlorine might be used in making the SORB material according to Equations I and III.

In a test experiment, a SORB material synthesized according to Example IV was etched at a rate of 824Å/min using $CF_4$ at 300 mTorr pressure, 100 sccm and 0.75 W/cm². An etch rate of 40Å/min was established using $O_2$ under the same conditions. Finally, etch rates of 4000Å/min at a 300 μm pressure and 1100Å/min at a 50 mTorr pressure were established for a 100 sccm $O_2$ gas flow of 90% $CF_4$/10% $O_2$ gas mixture.

The etch rates of the SORB materials synthesized according to Examples I, II and III were as low as 15, 0 and 10Å/min, respectively, in $O_2$ RIE at 300 mTorr, 100 sccm $O_2$ and 0.75 W/cm². These results are unexpected since the prior art shows a decrease in RIE resistance with a corresponding decrease in %Si. One explanation for these low etch rates centers around the methyl and phenyl orientations. More specifically, there appears to be a molecular arrangement dependence on a particular molecular pair, as opposed to the normal inclusion of silicon into the novolac set. These low etch rates indicate that there is negligible sputter removal of the SORB materials; i.e., there will be no RIE residue in the etched trenches of a patterned stencil and, therefore, no further clean-up process step such as buffered HF is necessary.

Experimentation has shown that the SORB materials may be deposited in films of up to 2.5 μm without cracking. The SORB materials are designed for use in trilayer processes and as a replacement for the sylilation technique. Utilization of the trilayer stencil could be single lift-off directly on the substrate, single lift-off on blanket aluminum or double lift-off directly on the substrate. The SORB materials are thermally stable up to 230° C. and are advantageous to use since they do not exhibit cracking and/or particulate contamination which would result in defects after use, as do normal spin on glass materials.

Referring now to the drawings and, more particularly to FIG. 3, the sequential steps of patterning a photoresist using a traditional trilayer process is shown. The trilayer stencil comprises a film of a lift-off polymer 31 on top of a substrate 30, onto which a film of the SORB material 33 and a layer of photoresist 35 are deposited. The lift-off polymer 31 must be a relatively dissolvable material such as a polyimide. After imaging and development of the photoresist 35, the resulting structure 37 is placed in a RIE tool and the SORB material 33 is etched using $CF_4$ or a $CF_4/O_2$ mixture. The lift-off polymer 31 is then etched with $O_2$ to completion, including a 50% overetch. The resulting etched stencil 41 lacks the presence of any RIE barrier material in the etched pattern areas 39. Metal may then be deposited on the etched areas 39 of the substrate 30.

EXAMPLE I

SORB I is synthesized by the reaction of dimethyldichlorosilane with Alnovol PN430 which is dissolved in n-butyl acetate. The solution is heated to the reflux temperature and allowed to reflux for 1 hour or until reaction completion. The solution is then cooled to room temperature and filtered through a 0.2 μm filter. The resulting viscous solution is diluted with n-butylacetate or left as is and spun on a wafer or substrate which is plain or already coated with a film to be protected from reactive ion etching.

EXAMPLE II

SORB II is synthesized by the reaction of methylphenyldichlorosilane with Alnovol PN430 which is dissolved in n-butyl acetate. The solution is heated to the reflux temperature and allowed to reflux for 1 hour or until reaction completion. The solution is then cooled to room temperature and filtered through a 0.2 μm filter. The resulting viscous solution is diluted with n-butylacetate or left as is and spun on a wafer or substrate which is plain or already coated with a film to be protected from reactive ion etching.

EXAMPLE III

SORB III is synthesized by the reaction of diphenyldichlorosilane with Alnovol PN430 which is dissolved in n-butyl acetate. The solution is heated to the reflux temperature and allowed to reflux for 1 hour or until reaction completion. The solution is then cooled to room temperature and filtered through a 0.2 μm filter. The resulting viscous solution is diluted with n-butylacetate or left as is and spun on a wafer or substrate which is plain or already coated with a film to be protected from reactive ion etching.

EXAMPLE IV

A polydimethylsilazane sol with a novolac resin. A solution is prepared using 15 grams of Alnovol PN430 dissolved in 80 grams of n-butylacetate. The solution is stirred and 7.5 grams polydimethylsilazane is added. The resulting solution is heated to a temperature of 126° C. and allowed to reflux for 31 hour. The solution is then cooled and applied to a wafer by spinning for 30 seconds at 1.25 kRPM and heating for ½ hour at 85° C. The resulting 4 μm film is etched using an RIE tool.

EXAMPLE V

A polymethylphenylsilazane solid is reacted with a novolac resin. A solution is prepared using 15 grams of Alnovol PN430 dissolved in 80 grams of n-butylacetate. The solution is stirred and 7.5 grams polymethylphenylsilazane is added. The resulting solution is heated to a temperature of 126° C. and allowed to reflux for 31 hour. The solution is then cooled and applied to a wafer by spinning for 30 seconds at 1.25 kRPM and heating for ½ hour at 85° C. The resulting 4 μm film is etched using an RIE tool.

EXAMPLE VI

A polydiphenylsilazane solid is reacted with a novolac resin. A solution is prepared using 15 grams of Alnovol PN430 dissolved in 80 grams of n-butylacetate. The solution is stirred and 7.5 grams polydiphenylsilazane is added. The resulting solution is heated to a temperature of 126° C. and allowed to reflux for 31 hour. The solution is then cooled and applied to a wafer by spinning for 30 seconds at 1.25 kRPM and heating for ½ hour at 85° C. The resulting 4 μm film is etched using an RIE tool.

While the invention has been described in terms of a several preferred embodiments, the suggested conditions were for demonstration only and may not necessarily be optimal for practice. Those skilled in the art will recognize that the invention can be practiced with modification within the spirit and scope of the appended claims.

Having thus described our invention, what we claim as new and desire to secure by Letters Patent is as follows:

1. A method of using a material as a reactive ion etch barrier material for forming a pattern on a substrate, comprising the steps of:

applying a lift-off polymer on said substrate;
applying said material on said lift-off polymer, said material being the reaction product of a novalac resin having phenolic groups and either
(i) a compound selected from the group consisting of a polydiphenylsilazane, a polydimethylsilazane, and a polymethylphenylsilazane, or
(ii) an organosilane compound having the formula:

wherein each of the A groups can be the same or different and are selected from the group consisting of a methyl group, a phenyl group, and a halogen, wherein one of said A groups is a halogen;
applying a photoresist material on said material;
patterning said photoresist and said material with an identical pattern; and
using said material after said patterning step as a reactive ion etch barrier material during reactive ion etching of said lift-off polymer in an oxygen ambient.

2. A method as recited in claim 1 wherein said step of applying said material is performed by a spin-on technique wherein said material is spun on to a thickness of up to 2.5 μm and is crack-free.

3. A method as recited in claim 1 wherein said material has the following chemical formula:

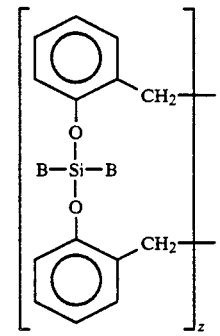

wherein the B group is selected from the group consisting of a methyl group and a phenyl group, and can be the same or different, and z is greater than 1.

4. A method of using a material as a reactive ion each barrier material during reactive ion etching in an oxygen ambient, comprising the steps of:

depositing on a first material which will be etched a second material which is the reaction product of a novalac resin having phenolic groups and either
(i) a compound selected from the group consisting of a polydiphenylsilazane, a polydimethylsilazane, and a polymethylphenylsilazane, or
(ii) an organosilane compound having the formula:

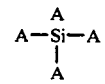

wherein each of the A groups can be the same of different and are selected from the group consisting of a methyl group, a phenyl group, and a halogen, wherein one of said A groups is a halogen;

patterning said second material; and using said second material after said patterning step as a reactive ion etch barrier material during reactive ion etching of said first material in an oxygen ambient.

5. A method as recited in claim 4 wherein said step of patterning is accomplished using reactive ion etching in a CF$_4$ ambient.

6. A method as recited in claim 4 wherein said material has the following chemical formula:

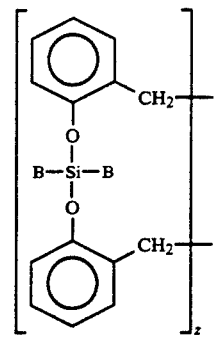

wherein the B group is selected from the group consisting of a methyl group and a phenyl group, and can be the same or different, and z is greater than 1.

* * * * *